United States Patent
Annis et al.

[11] Patent Number: 5,436,803
[45] Date of Patent: Jul. 25, 1995

[54] EMI SHIELDING HAVING FLEXIBLE CONDUCTIVE ENVELOPE

[75] Inventors: Gerald A. Annis, Honeoye Falls; William C. Hoge, Jr., Palmyra; Robert L. Welch, Webster, all of N.Y.

[73] Assignee: Schlegel Corporation, Rochester, N.Y.

[21] Appl. No.: 168,939

[22] Filed: Dec. 16, 1993

[51] Int. Cl.⁶ .................. H05K 9/00; H05K 5/02
[52] U.S. Cl. .................. 361/818; 174/35 R; 174/35 MS; 174/51; 439/607
[58] Field of Search .......... 174/35 R, 35 GC, 35 MS, 174/51; 361/816, 817, 818; 439/607–610

[56] References Cited

U.S. PATENT DOCUMENTS

| | | | |
|---|---|---|---|
| 2,875,435 | 2/1959 | McMillan | 174/35 MS |
| 2,913,577 | 11/1959 | Johnson | 250/20 |
| 3,383,455 | 5/1968 | Kerley, Jr. | 174/52 |
| 3,436,467 | 4/1969 | Smith, Jr. | 174/35 |
| 3,572,499 | 3/1971 | Mondano | 206/1 |
| 3,622,432 | 11/1971 | McCluer | 174/35 MS |
| 3,731,202 | 5/1973 | Meyers | 325/357 |
| 3,756,399 | 9/1973 | Cosler et al. | 206/80 A |
| 4,037,009 | 7/1977 | Severinsen | 174/35 MS |
| 4,227,037 | 10/1980 | Layton | 174/35 |
| 4,471,015 | 9/1984 | Ebneth et al. | 174/35 MS |
| 4,631,214 | 12/1986 | Hasegawa | 174/35 MS |
| 4,647,714 | 3/1987 | Goto | 174/36 |
| 4,654,755 | 2/1987 | Henderson et al. | 361/399 |
| 4,678,699 | 7/1987 | Kritchevsky et al. | 428/175 |
| 4,750,957 | 6/1988 | Gustafson | 156/92 |
| 4,774,148 | 9/1988 | Goto | 428/607 |
| 4,785,136 | 11/1988 | Mollet et al. | 174/35 R |
| 4,863,789 | 9/1989 | Arai | 428/253 |
| 4,896,001 | 1/1990 | Pitts et al. | 174/35 MS |
| 5,005,106 | 4/1991 | Kiko | 361/424 |
| 5,008,486 | 4/1991 | Terakawa et al. | 174/35 MS |
| 5,023,394 | 6/1991 | Watanabe et al. | 174/35 R |
| 5,031,076 | 7/1991 | Kiku | 361/424 |
| 5,115,140 | 5/1992 | Rodriguez | 250/516.1 |
| 5,134,245 | 7/1992 | Katz | 174/35 R |
| 5,136,119 | 8/1992 | Leyland | 174/35 R |
| 5,137,782 | 8/1992 | Adriaensen et al. | 428/370 |
| 5,164,542 | 11/1992 | Hart | 174/35 R |
| 5,166,864 | 11/1992 | Chitwood et al. | 361/386 |
| 5,170,009 | 12/1992 | Kadakura | 174/35 R |
| 5,198,290 | 3/1993 | Niioka | 428/263 |
| 5,226,210 | 7/1993 | Koskenmaki et al. | 29/527.5 |
| 5,239,125 | 8/1993 | Savage et al. | 174/35 MS |

FOREIGN PATENT DOCUMENTS

0460469A1 12/1991 European Pat. Off.
3276799 12/1991 Japan .................. 174/35 R Primary Examiner—Bot L. Ledynh
Attorney, Agent, or Firm—Eckert Seamans Cherin & Mellott

[57] ABSTRACT

An electronic device such as a portable computer is shielded against electromagnetic interference using a flexible envelope that surrounds a circuit card within the housing of the device. The flexible envelope forms a shielding enclosure and has an electrically insulating flexible sheet, for example of polyethylene, and a sheet of conductive fibers embedded in the flexible sheet so as to leave a nonconductive face oriented toward the circuit card. The conductive fibers can be metallized nylon and are sufficiently dense to obtain a resistivity of $10^{-1}$ to $10^{-2} \Omega/\square$. The enclosure forms a hollow envelope with the conductive fibers coupled electrically across a seam, for example by cutting the flexible sheet and embedded fibers using heat. For use with a portable computer having a pivoting screen, a neck extension of the enclosure carries conductors through the area of the pivot. For access to circuit board elements, for example for changing or adding chips, an access opening is provided with a conductive extension that is movable to overlap the opening or to expose the opening. The flexible envelope can be joined to a circuit ground by clamping conductive fibers on an exposed face to a metal connector panel of the device.

22 Claims, 3 Drawing Sheets

EMI SHIELDING HAVING FLEXIBLE CONDUCTIVE ENVELOPE

BACKGROUND OF THE INVENTION

1. Field of the Invention

The invention relates to the field of electromagnetic shielding structures for electronic units such as circuits, housings and subassemblies, using a flexible conductive envelope that encloses the electronic unit to prevent high frequency energy from passing into or out of a shielding boundary. More particularly, the invention concerns a flexible bag arrangement with access and conductor passages, suitable for the shielding of printed circuit cards of portable computers, notebook or palmtop devices and similar compact electronic devices requiring passage of signal or power conductors through the shielding boundary.

2. Prior Art

Electronic circuits operating at high frequencies or having high gain often emit or are sensitive to electromagnetic radiation. It is conventional to enclose such circuits in a conductive enclosure coupled to a circuit ground, to attenuate radiation that is emitted or received. The effectiveness of a shielding enclosure depends on its conductivity, its position relative to the shielded circuitry, the extent to which the enclosure continuously surrounds the circuits, and other factors. Improving the effectiveness of high frequency shielding thus generally requires more metal, defining a more continuous enclosure, and/or arranging the shield closer to the affected circuits. A conductive shielding enclosure may define gaps, depending on the frequencies to be shielded. However, to attenuate relatively higher frequency radiation effectively, any gaps must be correspondingly smaller.

In connection with computing and radio communications equipment, the frequencies of clock oscillators, multiplying phase locked loops and similar circuits may be quite high. The basic clock speed of a conventional portable computer, for example, typically ranges from 25 to 66 MHz, and advances are pushing the clock speeds upwardly. In addition, operations at different frequencies produce harmonics at the sum and difference of the frequencies, and in the portable computer example, harmonics up to 900 MHz or more may be present and may require shielding. This requires a very intensive shield, i.e., a nearly complete enclosure that is quite conductive and is placed close to the circuits that emit or are sensitive to the electromagnetic radiation.

The most typical shielding enclosure is a conductive box of continuous sheet metal, built of a plurality of rigid panels forming a rectilinear box around the affected circuits. The external housing of electronic equipment may include means forming a conductive box, and various subassemblies inside the box may be similarly enclosed in smaller boxes to prevent the subassemblies from inducing currents in one another. A number of problems are encountered in the manufacture and assembly of electronic equipment due to the need for such shielding, particularly in equipment based on printed circuits, in compact and/or light weight portable equipment and the like.

One problem is weight. It is not unusual for an electronic circuit to include various subassemblies that are separately shielded to prevent them from adding to the emissions of the assembly as a whole. Shielded subassemblies are likewise often provided within shielded subassemblies. For example, a portable computer may have an external housing having a sheet metal liner for shielding the housing, a switched mode power supply assembly that is separately shielded, a disc drive that has internally shielded driver and motor circuits within a sheet metal box, separate shielding associated with the keyboard or the display, and an internal shield or ground plane associated with the main printed circuit board. There is a need to optimize shielding to reduce weight. If the outer shielding could be optimized and made continuous, internal shielding could be reduced to the minimum needed to avoid cross coupling between subassemblies.

Another expense and complexity of manufacture is mounting of the shielding panels. For compactness, the sheet metal panels are carefully shaped to fit closely over the shielded components. Typically, the sheet metal panels have flanged edges with aligned holes for screws, rivets, bendable tabs and similar attachment means intended to permit assembly with other panels and with circuit card and housing structures, to form a self supporting metal box. This requires a plurality of complex shapes, fittings and assembly procedures for the shielding box and for the housing. The panels and their assembly and mounting must be handled with care to ensure a continuous close fitting enclosure that does touch or short circuit elements. Often it is necessary not only to provide a formed conductive panel, but also to attach standoffs or sheets of plastic or other electrical insulation over the conductive panel to prevent shorting. All these techniques add to the expense and weight of the unit.

It is known to attempt to alleviate shielding problems by making a plastic, normally-nonconductive housing into a conductive box by applying a conductive additive to the plastic, by applying a metallic coating layer, or by laminating the housing from alternating conductive and nonconductive sheets. These techniques are disclosed, for example, in U.S. Pat. Nos. 5,137,782—Adriaensen, et al. (embedded wires); 5,164,542—Hart (laminated wire screen); 5,170,009—Kadokura (electrodeposited coating); and 5,226,210—Koskenmaki, et al. (conductive paint coating). Such techniques are helpful as to shielding, but add to manufacturing complexity, particularly if the internal surface facing the shielded circuitry must be nonconductive to avoid shorting, and must be free of gaps, for example caused by scratching a coating.

According to an aspect of the present invention, shielding is provided in the form of a flexible nonconductive envelope with embedded conductive fibers sufficient to provide a low resistivity as needed for electromagnetic shielding, i.e., on the order of $10^{-1}$ to $10^{-2} \Omega/\square$, and a nonconductive surface facing toward the shielded circuit. The envelope is flexibly arranged around the shielded circuit, and can have passages for conductors and/or access, providing the advantages of rigid panel shielding without the manufacturing and assembly problems.

Flexible plastic bags with conductive coatings on an exterior side are known in connection with shipping bags intended to avoid damage to sensitive CMOS integrated circuits and the like due to electrostatic discharge. A person handling the protected circuit first touches the conductive bag, whereupon any potential difference due to static electricity is equalized, sometimes with the occurrence of a discharge or spark. Protection from electrostatic discharge is unlike high frequency shielding in that the energy of a static electricity discharge, occurring for example with manual handling, is normally very low. The discharge occurs at a point and is characterized by relatively low frequencies. The circuit is normally not operational, but is packed for shipment. The objective is simply to prevent the discharge from damaging the thin semiconductor junctions of the CMOS circuits.

Protective shipping bags for circuit cards accordingly have a very thin external metallized layer to dissipate static discharges, normally so thin that one can see through readily. The metallization is minimal because attenuation of the discharge by 20 dB is adequate for circuit protection. Electrostatic discharge packaging functions adequately for its purposes even when the packaging leaves gaps open at closures or perhaps where the metallization is scratched or worn. Normally, however, the open end of the bag extends beyond the enclosed circuit card and is folded over and taped, leaving no passages to the circuit card without touching and removing the bag.

It is known to provide electrostatic discharge protection as a permanent feature of a circuit card mounting, for example as in U.S. Pat. No. 5,005,106—Kiku, where such a structure protects the circuitry of an integrated circuit bank card or smartcard from electrostatic discharge, and resides in a plastic housing with the circuitry. This unit is self contained, and thus the electrostatic discharge material does not interfere with other aspects of circuit operation and mounting. The discharge-protective structure does not form a complete envelope around the affected circuit. Kiku uses a minimally conductive film rather than highly conductive embedded fibers as needed for shielding against electromagnetic interference. No means are provided such as an extension neck, access opening or the like for dealing with passage of conductors or access to the circuit elements.

It is also known to wrap a circuit card with a web of discharge protective shielding material as in U.S. Pat. No. 4,896,001—Pitts et al. According to Pitts, an electrostatic discharge material in the form of a web is provided on the high end of the conductivity range for electrostatic discharge protection. This effectively compromises electrostatic discharge protection to improve shielding against interference, and compromises shielding effectiveness to improve electrostatic discharge protection. Whereas the web is wrapped over itself and around the circuit card, the circuit card is not closely sealed and the result is not a complete envelope forming a full shielding barrier.

Another possibility is to cure nonconductive and conductive materials in alternating layers directly on the circuit card elements. However, this precludes any further access to the circuit card elements and tends to confine heat. High frequency devices, such as the processor of a computer, tend to dissipate substantial heat. It also is desirable to reserve access to the circuit card, for example to allow a math coprocessor circuit to be added or to allow the processor chip to be replaced, via a zero-insertion force (ZIF) mounting arrangement.

For electromagnetic shielding of circuits that are sensitive due to high gain and/or operation at high frequencies, as well as circuits that emit the offending high frequency electromagnetic radiation, a great deal more conductive material and a more complete conductive enclosure are needed for shielding against electromagnetic interference (EMI) than for protecting against electrostatic discharge (ESD). An adequate shield for EMI purposes should attenuate radiation at 50 to 60 dB over a frequency range of 30 MHz to 1.0 GHz. The shield must be substantially continuous and must enclose the shielded circuits closely and completely, i.e., forming a closed highly conductive envelope. Whereas electrostatic discharge packaging may require a surface resistivity of $10^{+1}$ to $10^{+12}$ $\Omega/\square$, electromagnetic shielding has a surface resistivity of $10^{-1}$ to $10^{-7}$ $\Omega/\square$.

It would be advantageous to provide a flexible enclosure that is more intensively conductive, for use as a shield in place of rigid sheet metal panels and boxes. The present invention concerns a low-resistivity flexible shielding envelope that can be mounted in a device such as a portable computer or the like, having an insulated side facing the circuit and a conductive side facing the envelope, and with access provided to the circuit and/or means available for passing signal lines or power lines through the shield barrier while maintaining a complete shield barrier.

SUMMARY OF THE INVENTION

It is an object of the invention to provide high frequency electromagnetic shielding in the form of a flexible conductive membrane that has very low resistivity, an electrically insulated inside surface and means for forming the membrane into a an electrically continuous envelope.

It is another object to facilitate shielding of devices requiring access and/or passage of conductors through a shielding barrier.

It is a further object to provide a shield for printed circuit cards and the like, that arranges a low resistance sheet closely adjacent circuit elements, without the need to form the shield to a particular contour.

It is also an object to provide a shield structure that is inexpensive and effective for shielding compact and portable high frequency apparatus such as computers and communication devices.

These and other objects are accomplished in an electronic device such as a portable computer, shielded against electromagnetic interference according to the invention, using a flexible envelope that surrounds a circuit card within the housing of the device. The flexible envelope forms a shielding enclosure and has an electrically insulating flexible sheet and a sheet of conductive fibers embedded in the flexible sheet so as to leave a nonconductive face oriented toward the circuit card. The insulating sheet can be a thermoformable polymer, preferably a thermoplastic, such as, polyethylene, polyethylene terephthalate, polyvinyl chloride, or the like, and are sufficiently flexible. The conductive fibers can be metal fibers, metal alloy fibers, metallized nylon fibers, or the like, and are sufficiently dense to obtain a resistivity of $10^{-1}$ to $10^{-2}$ $\Omega/\square$. The enclosure forms a hollow envelope with the conductive fibers coupled electrically across a seam, for example by cutting the flexible sheet and embedded fibers using heat. For use with a portable computer having a pivoting screen, a neck extension of the enclosure carries conductors through the area of the pivot. For access to circuit board elements, for example for changing or adding chips, an access opening is provided with a conductive extension that is movable to overlap the opening sufficiently for shielding, preferably to overlap conductive material over a distance of a plurality of wavelengths at the frequency of interest. This conductive extension or flap can be moved to expose the opening when access is needed. The flexible envelope can be joined to a circuit ground by clamping conductive fibers on an exposed face to a metal connector panel of the device.

BRIEF DESCRIPTION OF THE DRAWINGS

There are shown in the drawings certain exemplary embodiments of the invention as presently preferred. It should be understood that the invention is not limited to the embodiments disclosed as examples, and is capable of variation within the scope of the appended claims. In the drawings.

DETAILED DESCRIPTION OF THE PREFERRED EMBODIMENTS

Figure 1:
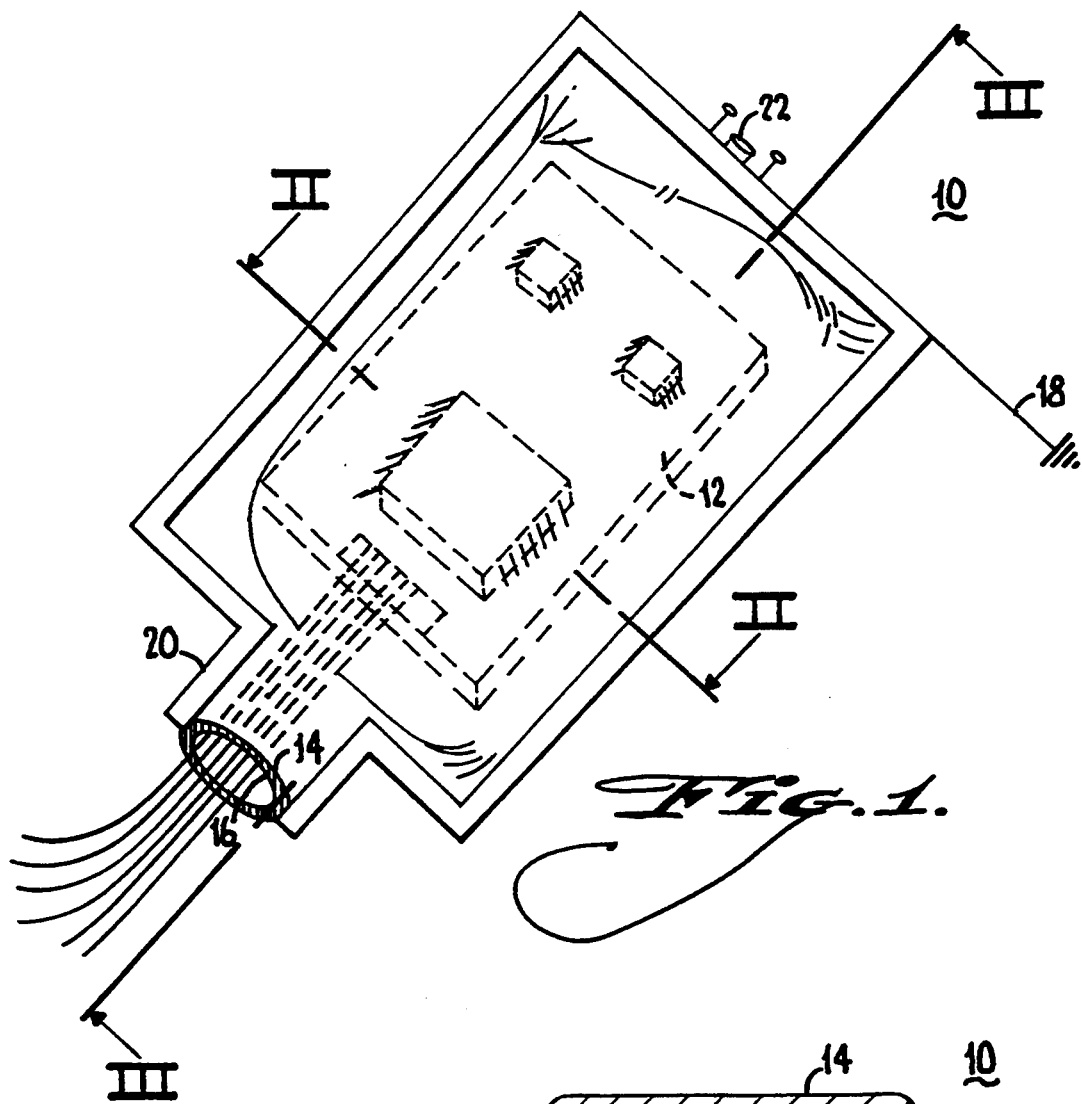
FIG. 1 is a perspective view of a circuit card enclosed within a thin, flexible electromagnetic shielding envelope according to the invention.
Figure 2:
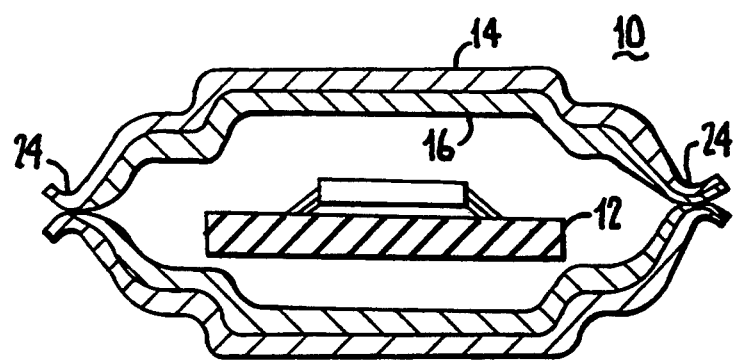
FIG. 2 is a cross sectional view of the arrangement of FIG. 1 along line 2—2.
Figure 3:
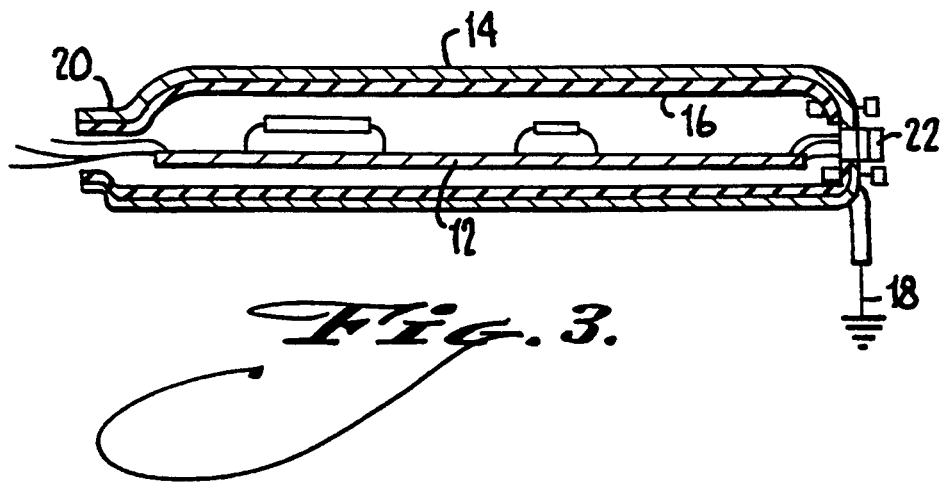
FIG. 3 is a side sectional view of the arrangement of FIG. 1 along line 3—3.

The invention provides a flexible shielding enclosure from a composite of conductive fibers for use in shielding against the passage of electromagnetic interference as effectively as a sheet metal box arrangement, but without the manufacturing complexity and expense associated with such metal boxes. As shown in FIGS. 1, 2, and 3 the shielding material forms a flexible electrically conductive envelope 10 for the shielded circuit 12 from an electrically insulating flexible sheet having a sheet of conductive fibers embedded therein. As shown in FIGS. 1 and 2, the envelope forms a loose conductive enclosure in the manner of a flexible bag around the circuit, into which the circuit is simply inserted to effect shielding. The conductive fibers are sufficiently dense to obtain a resistivity of $10^{-1}$ to $10^{-2}$ $\Omega/\square$, thereby obtaining attenuation of electromagnetic interference or "EMI" of 50 to 60 dB over the frequency range 30 MHz to 1.0 GHz. The conductive fibers forming a conductive face 14 are spaced from at least one side of the flexible sheet forming an insulating face 16 that is directed toward the shielded circuit. The conductive fibers are coupled to circuit ground 18 via a suitable connecting element (not shown) such as a screw passed through the shielding envelope.

In the embodiment shown in FIG. 1, two thicknesses of the sheet and its embedded fibers are attached at their edges to form an enclosure 10 that is sized for at least one electrical circuit or device, such as a printed circuit card. Whereas the insulating face 16 is oriented inwardly toward the electrical circuit, the shielding enclosure may reside very close to the circuit elements and preferably rests against certain of the circuit elements. However, the conductive fibers are insulated from electrical contact by the nonconductive flexible sheet 16, and remain spaced slightly from the electrical elements. This close positioning of the conductive portion 18 of the shield to the circuits aids in shielding effectiveness. At one end of the envelope, an extension or neck 20 can be provided that allows the shield enclosure to extend outwardly, for example to accommodate conductors (not shown). At the other end of the envelope, a connector terminal 22 can be provided that allows an external element to operatively connect to the enclosed circuit card.

The conductive fibers can be metal fibers, metal alloy fibers, metallized synthetic fibers, such as metal plated nylon fibers, or the like. The conductive fibers are embedded in the flexible sheet in an amount sufficient to form an electrically conducting layer while also maintaining flexibility of the flexible sheet. According to one embodiment, the fibers are silver metalized nylon fibers, for example with 24 to 30% by weight of silver applied by an electro-less plating process. Copper or a copper-nickel alloy can also be used (e.g., at 40 to 60% by weight).

The conductive fibers preferably form a nonwoven batt with a sufficient proportion of the adjacent fibers in electrically conductive contact to obtain a resistivity of $10^{-1}$ to $10^{-2}$ $\Omega/\square$. Only small dimension gaps remain through the shielding material that would permit passage of electromagnetic radiation. Whereas any gaps are small, the shielding barrier is effective for attenuating relatively high frequencies.

The flexible insulating sheet can be a thermoformable polymeric material, preferably a thermoplastic material, such as polyethylene, polyethylene terephthalate, polyvinyl chloride, or the like, polyethylene being most preferred. According to an aspect of the invention, the thermoformable nature of the insulating layer enables adjoining portions to be attached by heat welding facing portions.

Accordingly, as shown in FIG. 2, the conductive fibers can be arranged to continue the shielding barrier across one or more seams 24 where the adjacent edges of the flexible sheet and embedded conductive fibers come together. It is also possible that the adjacent portions can be attached by sewing, taping, adhering via a preferably-conductive adhesive, or by a mechanical fastening such as a slot and bead (Zip-lock) means. According to a preferred arrangement, continuing the electrically conductive nature of the material across a seam 24 is accomplished by heat welding the edges of the material at the seam so that the conductive fibers come into electrical contact. This can be accomplished readily due to the thermoplastic nature of the insulating sheet and the preferred conductive fibers.

A hot cutting operation can be used to compress and melt the sheet at the seam, or the sheet can be sheared and heat sealed, preferably with compression, for causing the conductive fibers on the edges adjacent the seam to electrically engage, and forming a continuous shield barrier in a convenient manner. The hot cutting operation causes the thermoplastic insulating material and the conductive fibers embedded therein to melt and reform along the seam line. It would also be possible to provide other specific means to heat and compress the sheets with similar results to that obtained with a heated knife, such as ultrasonic welding together with compression, and this technique can also be used to provide shielding material that subdivides a shielded enclosure into two or more subenclosures.

The insulating sheet is preferably a thin, flexible, polyethylene sheet but having sufficient thickness to resist incidental damage, for example of 40 to 60 lbs./ream (0.2 to 0.3 g/cm$^2$), preferably 48 lbs./ream (0.25 g/cm$^2$). The embedded conductive fiber can be, for example, a metal plated nylon fiber. An HCl bonded silver plated nonwoven nylon fiber is a preferred fiber material, such as silver Cerex (a trademark of James River-Norwalk, Inc., Norwalk, Conn. Another possible material is pin-bonded silver plated nonwoven nylon fiber, such as PBN-II (a trademark of Fiberweb North America, Inc., Greenville, S.C.). These materials allow a conductive seam to be formed simply by cutting through two or more layers of the shielding material with a heated knife. The structure is formed generally into a hollow flexible envelope.

Figure 4:
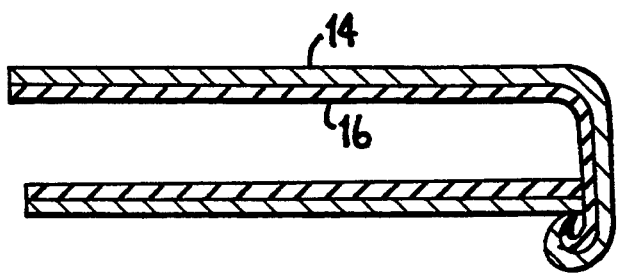
FIG. 4 is a side sectional view of another embodiment of a thin, flexible electromagnetic shielding enclosure according to the invention.

The metalized fiber can be embedded in the insulating sheet, for example by extrusion coating the nonwoven metalized fiber batt with the polyethylene or other insulating material. In the alternative embodiment shown in FIG. 4, an overlap 26 can be provided at which a seam forming the envelope is made, however, the conductive fiber is spaced from the insulating inner face of the material, and preferably is exposed on the outer face. The overlap allows easier assembling of the enclosure and also provides an access opening for removably mounting a circuit board enclosed within the envelope. Where an overlap is relied upon to continue the shield electrically over a seam, it is necessary to fold the material under so as to cause the conductive outer faces of the adjoined sheets to abut in electrical contact. As shown in FIG. 4, the shielding enclosure substantially defines a rectilinear envelope dimensioned to receive the circuit card, folded along one edge and seamed along two edges via heat welding as explained above. The envelope engages around a circuit card and a flap 26 at the open end is folded over the envelope and affixed, preferably conductively, against the outer surface of the envelope.

The invention is particularly applicable to shielding the printed circuit board or boards of lightweight portable devices such as portable computers. For this purpose the shielding enclosure advantageously includes at least one neck extension of the enclosure, dimensioned for passage of at least one conductor such as a ribbon cable that couples the mother board of the computer through a mechanical pivot coupling to a display unit that folds up from the housing of the portable computer. This extension neck is also easily formed by cutting the required shape from two overlapped sheets of the shielding material, laid with their insulating faces against one another and their conductive faces outwardly.

Figure 5:
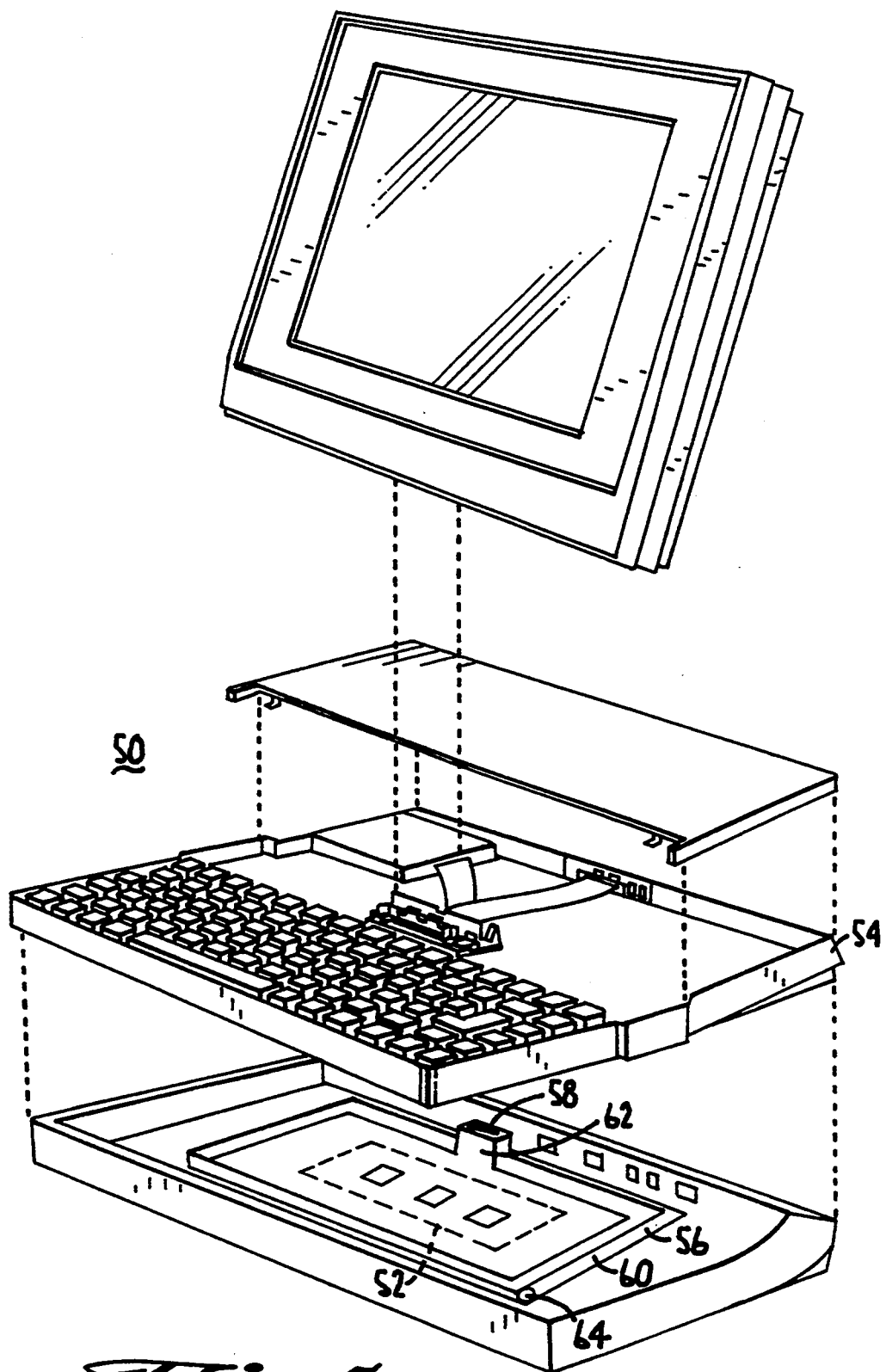
FIG. 5 is a perspective view of a portable computer having a motherboard enclosed within an electromagnetic shielding envelope according to the invention.

A shielded electronic device 50 according to the invention, such as a portable computer, is shown in FIG. 5. The device includes at least one electrical circuit such as the motherboard 52, carrying circuit elements that may include a high frequency crystal oscillator (not shown), a processor chip (not shown) and perhaps a math coprocessor (not shown). The outer shell of the device comprises a substantially rigid housing 54 for enclosing the electrical circuit. Rather than, or in addition to forming the housing of a conductive material and then providing a mounting for the electrical circuit that ensures there will be no contact between the circuit card and the housing (which if conductive is normally grounded), according to the invention a flexible shielding enclosure 56 is disposed around the electrical circuit and inside the housing. The shielding enclosure 56 as described above includes an electrically insulating flexible sheet with a sheet of conductive fibers embedded in the flexible sheet so as to be spaced from that surface of the flexible sheet that forms an insulating face 58 oriented inwardly toward the electrical circuit and a conductive face 60 oriented outwardly toward the housing.

Whereas the conductive fibers are sufficiently dense to obtain a resistivity of $10^{-1}$ to $10^{-2}$ $\Omega/\square$, the shielding enclosure can attenuate by 50 to 60 dB the high frequency electromagnetic radiation produced. Such radiation is typically generated on the order of the clock speed of the computer (e.g., 16 to 100 MHz) as well as the harmonics that are produced with generation of different frequency components and the ringing of the switched circuits. The material as described can provide such attenuation over a frequency range of 30 MHz to 1.0 GHz.

The flexible shielding enclosure has at least one seam at which adjacent portions of the conductive sheet are arranged to continue the shielding barrier formed by the conductive fibers across the adjacent portions. In this embodiment there are several seams 60 at which the conductive fibers are engaged or where the conductive fibers are electrically coupled to a means for coupling the conductive portion of the shield to a circuit ground.

Along a neck 62 extension of the shielding enclosure, two seams define a tube dimensioned for passage of a ribbon cable or the like whereby a circuit card in the base portion of the housing can be coupled to a display circuit 64 in a pivoting display panel. Another seam is provided at a flap 64 affixed adjacent an access opening at which the sheet and the embedded fibers are movably disposed to expose or cover the access opening. This access opening is preferably arranged over a circuit card position in which an integrated circuit package is removably mounted, for example to allow a processor chip to be updated with an improved processor chip having a corresponding pin-out arrangement via a zero-insertion-force (ZIF) mounting. Similarly, it is normally optional to provide a math coprocessor chip in a portable computer, and a similar access opening can be provided to enable a coprocessor to be installed after original production of the portable computer, and without removing the greater part of the shield.

FIG. 5 also shows a preferred means for coupling the conductive fiber portion of the shield material to the circuit ground of a portable computer or other device having an electrical connector traversing the shield boundary at a mounting plate. The conductive fibers in this embodiment can be exposed on a face opposite from the insulating face of the material, or a connecting means such as a screw can pass through the conductive fiber portion for making an electrical connection between the shield and a grounded point such as a conductive mounting plate of a connector panel coupled to the circuit ground. The means for coupling the conductive fibers to the circuit ground of the circuit card can comprise a fastener as described, or alternatively a clamping means or conductive adhesive connection can be provided to cause conductive fibers on the exposed face to engage against the connector panel.

The invention provides a continuous and effective shielding boundary when completely closed and electrically joined according to the invention. The extension neck can extend the shield along conductors that traverse the shield barrier. A similar neck arrangement or attachment of the conductive shield to a housing element can also be used, for example, to permit a flow of cooling air or the like across the circuit card enclosed within the EMI shield.

The invention having been disclosed in connection with the foregoing variations and examples, additional variations will now be apparent to persons skilled in the art. The invention is not intended to be limited to the variations specifically mentioned, and accordingly reference should be made to the appended claims rather than the foregoing discussion of preferred examples, to assess the scope of the invention in which exclusive rights are claimed.

We claim:

1. A shielding enclosure comprising:
an electrically insulating flexible sheet;
a sheet of conductive fibers embedded in the flexible sheet and spaced from at least one side of the flexible sheet so as to present an insulating face at least on said at least one side;
wherein the flexible sheet and the embedded fibers are formed into a loose and flexible bag enclosure sized to substantially surround at least one electrical circuit, with the insulating face oriented inwardly toward the electrical circuit, the flexible sheet following the contour of the electrical circuit and the embedded fibers forming a substantially continuous shielding barrier around the enclosure; and,
means for coupling the conductive fibers to a circuit ground of the electrical circuit.

2. The shielding enclosure according to claim 1, wherein the conductive fibers provide 50 to 60 dB attenuation of electromagnetic interference having a frequency of 30 MHz to 1.0 GHz.

3. The shielding enclosure according to claim 1, further comprising at least one neck extension of the enclosure, dimensioned for passage of at least one conductor.

4. The shielding enclosure according to claim 1, wherein the conductive fibers comprise a nonwoven sheet of metallized thermoplastic fibers.

5. The shielding enclosure according to claim 4, wherein the electrically insulating flexible sheet comprises a thermoplastic material.

6. The shielding enclosure according to claim 5, wherein the electrically insulating flexible sheet comprises polyethylene and the metallized thermoplastic fibers comprise metallized nylon.

7. The shielding enclosure according to claim 1, wherein the conductive fibers are sufficiently dense to obtain a resistivity of $10^{-1}$ to $10^{-2}$ $\Omega/\square$.

8. A shielding enclosure comprising:
an electrically insulating flexible sheet;
a sheet of conductive fibers embedded in the flexible sheet, the conductive fibers being sufficiently dense to obtain a resistivity of $10^{-1}$ to $10^{-2}$ $\Omega/\square$, the fibers being spaced from at least one side of the flexible sheet forming an insulating face;
wherein the flexible sheet and the embedded fibers are formed into a loose and flexible bag enclosure sized to substantially surround at least one electrical circuit, with the insulating face oriented inwardly toward the electrical circuit, the flexible sheet being non-molded and following the contour of the electrical circuit and the embedded fibers forming a substantially continuous shielding barrier around the enclosure; and,
means for coupling the conductive fibers to a circuit ground of the electrical circuit; and,
wherein the enclosure is formed into a hollow envelope by at least one seam, and further comprising means for electrically coupling the conductive fibers across the seam.

9. The shielding enclosure according to claim 8, wherein the electrically insulating flexible sheet comprises a thermoplastic material with the conductive fibers embedded therein, and wherein the seam comprises a melted and reformed line along the thermoplastic material at which the conductive fibers are brought into electrical contact across the seam.

10. The shielding enclosure according to claim 8, wherein the conductive fibers are exposed on a conductive side of the enclosure opposite from the insulating face, and wherein the seam comprises a fold at which the conductive sides of adjacent portions of the flexible sheet are overlapped.

11. A shielding enclosure comprising:
an electrically insulating flexible sheet;
a sheet of conductive fibers embedded in the flexible sheet, the conductive fibers being sufficiently dense to obtain a resistivity of $10^{-1}$ to $10^{-2}$ $\Omega/\square$, the fibers being spaced from at least one side of the flexible sheet forming an insulating face;
wherein the flexible sheet and the embedded fibers are formed into a loose and flexible bag enclosure sized to substantially surround at least one electrical circuit, with the insulating face oriented inwardly toward the electrical circuit, the flexible sheet conforming loosely to the electrical circuit and the embedded fibers forming a substantially continuous shielding barrier around the enclosure; and,
means for coupling the conductive fibers to a circuit ground of the electrical circuit;
at least one neck extension of the enclosure, dimensioned for passage of at least one conductor; and,
wherein the electrically insulating flexible sheet comprises a thermoplastic material with the conductive fibers embedded therein, having layers arranged to define at least one seam bordering at least one of the enclosure and the neck extension, and wherein the seam comprises a melted and reformed line along the thermoplastic material at which the conductive fibers are in electrical contact across the seam.

12. A shielding enclosure comprising:
an electrically insulating flexible sheet;
a sheet of conductive fibers embedded in the flexible sheet, the conductive fibers being sufficiently dense to obtain a resistivity of $10^{-1}$ to $10^{-2}$ $\Omega/\square$, the fibers being spaced from at least one side of the flexible sheet forming an insulating face;
wherein the flexible sheet and the embedded fibers are formed into a loose and flexible bag enclosure sized to substantially surround at least one electrical circuit, with the insulating face oriented inwardly toward the electrical circuit, the flexible sheet being non-molded and following the contour of the electrical circuit and the embedded fibers forming a substantially continuous shielding barrier around the enclosure; and,
means for coupling the conductive fibers to a circuit ground of the electrical circuit; and,
wherein the enclosure defines at least one access opening, and further comprising an extension of the enclosure adjacent the access opening and dimensioned to cover the access opening, conductive fibers of the extension being electrically coupled to the conductive fibers of the sheet of conductive fibers such that the extension continues the shielding barrier across the access opening.

13. A shielding enclosure comprising:

an electrically insulating flexible sheet;

a sheet of conductive fibers embedded in the flexible sheet, the conductive fibers being sufficiently dense to obtain a resistivity of $10^{-1}$ to $10^{-2}$ $\Omega/\square$, the fibers being spaced from at least one side of the flexible sheet forming an insulating face;

wherein the flexible sheet and the embedded fibers are formed into a loose and flexible bag enclosure sized to substantially surround at least one electrical circuit, with the insulating face oriented inwardly toward the electrical circuit, the flexible sheet being non-molded and following the contour of the electrical circuit and the embedded fibers forming a substantially continuous shielding barrier around the enclosure; and, means for coupling the conductive fibers to a circuit ground of the electrical circuit;

wherein the conductive fibers comprise a nonwoven sheet of metallized thermoplastic fibers including nylon, the electrically insulating flexible sheet comprises a thermoplastic material including polyethylene; and, wherein the enclosure is formed with at least one seam at which the electrically insulating flexible sheet is melted and reformed so as to join the conductive fibers electrically across the seam, the seam defining at least one of a neck extension of the enclosure, dimensioned for passage of at least one conductor, and an access flap at which a portion of the enclosure is displaceable to obtain access to an inside of the enclosure.

14. A shielding electronic device, comprising:

at least one electrical circuit carrying circuit element;

a substantially rigid housing for enclosing the electrical circuit;

a flexible shielding enclosure disposed around the electrical circuit and inside the housing, the shielding enclosure including an electrically insulating flexible sheet with a sheet of conductive fibers embedded in the flexible sheet so as to be spaced from at least one surface of the flexible sheet forming an insulating face oriented inwardly toward the electrical circuit, the flexible sheet forming a loose and flexible bag enclosure conforming to the electrical circuit and the embedded fibers forming a substantially continuous shielding barrier around the enclosure, the conductive fibers being sufficiently dense to obtain a resistivity of $10^{-1}$ to $10^{-2}$ $\Omega/\square$, the flexible shielding enclosure having at least one seam at which adjacent portions of the conductive sheet are arranged to continue a shielding barrier formed by the conductive fibers across the adjacent portions; and, means for coupling the conductive fibers to a circuit ground of the electrical circuit.

15. The shielded electronic device according to claim 14, wherein the electrically insulating flexible sheet comprises a thermoplastic material with the conductive fibers embedded therein, and wherein the seam comprises a melted and reformed line along the thermoplastic material at which the conductive fibers are brought into electrical contact across the seam.

16. The shielded electronic device according to claim 15, wherein the seam borders at least one of an access opening at which the sheet and the embedded fibers are movably disposed to expose or cover the access opening, and a neck extension of the enclosure, dimensioned for passage of at least one conductor, and.

17. The shielded electronic device according to claim 16, wherein the conductive fibers comprise a nonwoven sheet of metallized thermoplastic fibers.

18. The shielded electronic device according to claim 17, wherein the electrically insulating flexible sheet comprises a thermoplastic material.

19. The shielded electronic device according to claim 18, wherein the electrically insulating flexible sheet comprises polyethylene and the metallized thermoplastic fibers comprise metallized nylon.

20. The shielded electronic device according to claim 19, wherein the electrical circuit comprises a printed circuit card of a portable computer, wherein the portable computer comprises a display coupled to the printed circuit card by conductors, and wherein the enclosure comprises an extension neck surrounding the conductors and extending toward the display.

21. The shielded electronic device according to claim 20, wherein the display is movably attached to the housing at a pivot, and the extension neck surrounds the conductors in an area of the pivot.

22. The shielded electronic device according to claim 17, wherein the conductive fibers are exposed on a face opposite from the insulating face, wherein the electrical circuit includes a conductive connector panel coupled to the circuit ground and having at least one electrical connector for coupling the electrical circuit to an external device, and wherein the means for coupling the conductive fibers to the circuit ground of the circuit card comprises at least one clamping means at which the conductive fibers on the exposed face are clamped against the connector panel.

* * * * *